United States Patent [19]
Cox et al.

[11] Patent Number: 4,550,389
[45] Date of Patent: Oct. 29, 1985

[54] APPARATUS AND METHOD FOR SWITCHING A MAGNETIC DOMAIN LENS

[75] Inventors: David L. Cox, Valencia; William E. Ross; Calvin A. Toche, both of Woodland Hills, all of Calif.

[73] Assignee: Litton Systems, Inc., Beverly Hills, Calif.

[21] Appl. No.: 523,011

[22] Filed: Aug. 15, 1983

[51] Int. Cl.⁴ .................. G11C 11/14; G11C 11/42
[52] U.S. Cl. .................. 365/37; 365/10; 365/11; 365/19; 365/122
[58] Field of Search .................. 365/37, 58, 19, 20, 365/21, 11, 10, 122

[56] References Cited

U.S. PATENT DOCUMENTS

| | | | |
|---|---|---|---|
| 3,715,736 | 2/1973 | O'Donnell et al. | 365/37 |
| 4,500,176 | 2/1985 | MacNeal | 365/2 |
| 4,500,177 | 2/1985 | MacNeal | 365/2 |

OTHER PUBLICATIONS

SPIE, vol. 341, Real Time Signal Processing V (1982) pp. 191-198.

*Primary Examiner*—James W. Moffitt

[57] ABSTRACT

A magnetic domain device has at least one post element formed from a material that exhibits magnetic domain characteristics and that is positioned on a nonmagnetic substrate material. A pair of electrical drive lines associated with a post element permit coincident current selection of the post element to nucleate a magnetic domain reversal, and an additional current introduced into an adjacent drive line establishes an additive magnetic field to assist the propagation of a domain wall associated with the nucleated magnetic domain reversal so that the direction of magnetization of the post element is reversed.

16 Claims, 2 Drawing Figures

APPARATUS AND METHOD FOR SWITCHING A MAGNETIC DOMAIN LENS

TECHNICAL FIELD

An apparatus and method for directing an additive current, and thus an additive magnetic field, to enhance the addressing or selection of post elements in a magnetic domain lens.

BACKGROUND ART

In the field of magnetic domain devices, materials that exhibit magnetic domain characteristics, the behavior of such magnetic domains, and the use of these magnetic domain materials in sensing and display devices have been described: see United Kingdom Pat. No. 1,180,334; Krumme, J-P et al., "Ferrimagnetic Garnet Films for Magnetooptic Information Storage", IEEE Transactions on Magnetics, Vol. Mag-11, No. 5, Sept. 1975, page 1097; Lacklison, D.E. et al., "The Magnetooptic Bubble Display", IEEE Transactions on Magnetics, Vol. Mag-13, No. 3, May 1977, page 973; Lacklison, E.E. et al., "Magneto-Optic Displays", IEEE Transactions on Magnetics, Vol. Mag-11, No. 5, Sept. 1975, page 1118; Hill, B. And Schmidt, K.P., "Fast Switchable Magneto-Optic Memory Display Components", Phillips Journal of Research, Volume 33, Nos. 5/6, 1978, page 211; Almasi, G.S., "Magnetooptic Bubble-Domain Devices", IEEE Transactions on Magnetics, Vol. Mag-7, No. 3, Sept. 1971, page 370; U.S. Pat. No. 3,815,107; and U.S. Pat. No. 3,526,883.

Certain magnetic domain or magneto-optic display devices change or switch the direction of magnetization M of a magnetic material formed into individual post elements through electrical conductors or drive lines that establish a magnetic field having an opposite direction of magnetization. ("Fast Switchable Magneto-Optic Memory Display Components", supra; and U.S. Pat. No. 4,114,191). An external bias field may be required (U.S. Pat. No. 4,114,191) or it may be omitted (United Kingdom Pat. No. 1,180,334). When a magnetic field is established having a strength equal to or greater than $Hk-4\pi Ms$, the reversal of the direction of magnetization or switching occurs.

This process of switching involves two parts: nucleation of a domain wall and the movement or propagation of the domain wall toward or to complete saturation. A magnetic domain wall is established by nucleation within the magnetic material of the selected post element. This domain wall is formed between opposite orientations of M at the interface between the initial condition of magnetization and the nucleated opposite magnetic condition. The remainder of the element is switched by propagating the domain wall through the thickness of the element so that part or all of the entire element exhibits a direction of magnetization opposite to the initial condition, i.e., partial or complete saturation.

It is known that the magnetic field required for nucleation is greater than that required for propagating the domain wall because wall motion is limited by demagnetizing and coercivity effects. The field established by the selected row-and-column conductors diminishes rapidly as the distance from the conductors increases. Thus, it is understood that value of the magnetic field adjacent to the energized conductors is large while the field in the region of the post element opposite the energized conductors is relatively small. Therefore, a much larger field is required to propagate the domain wall across the post element where only a single row and a single column conductor are energized.

This invention, an apparatus and method for switching a magnetic domain lens enhances the switching process in a magnetic material, particularly in that material which is formed into pixel or post elements, by directing an additional electrical current in a selected third electrical conductor during or subsequent to the coincident current selection of a row and a column conductor which cross and adjoin a selected post element of the magnetic domain lens. In so doing, the efficiency of the magnetic domain lens is substantially increased by propagating the domain wall across the post element with reduced electrical current in the selected paired and third conductors.

DISCLOSURE OF INVENTION

The invention as claimed is an apparatus and method for switching a magnetic domain lens using an additional current pulse in an existing conductor to enhance the selection of a post element in the lens for magnetic switching and the completion of such switching with minimum electrical current.

These advantages of the invention are realized by the addition of a current in a conductor adjacent to but spaced apart from one of the row-and-column conductors selected to nucleate the change in magnetic direction M of a post element in the magnetic domain lines.

BRIEF DESCRIPTION OF THE DRAWINGS

The invention is described in detail below with references to the drawing that illustrates one specific embodiment, in which.

BEST MODE OF CARRYING OUT THE INVENTION

Figure 1:
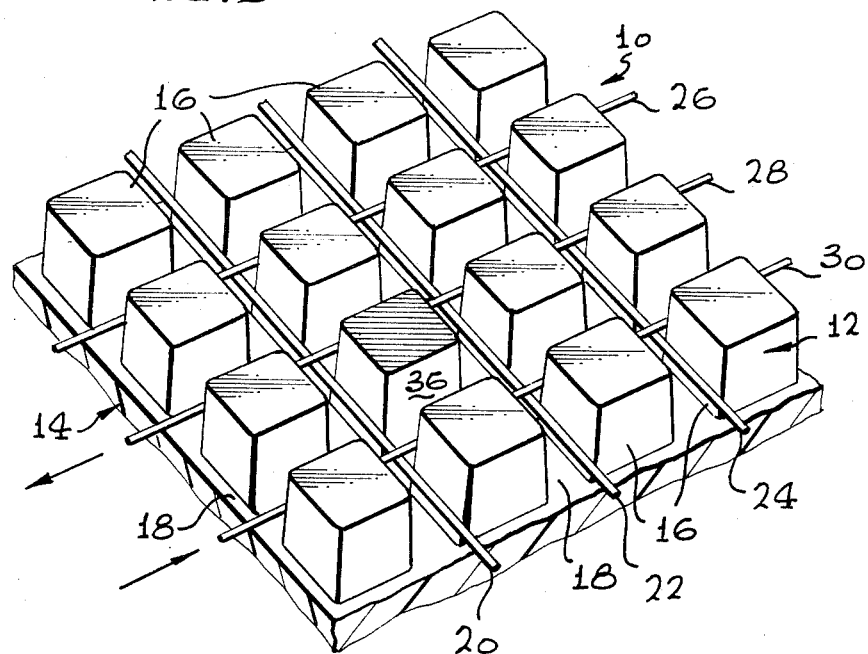
FIG. 1 is an enlarged perspective view, partly broken away, of a magnetic domain lens of the invention.

A magneto-optic display 10 as shown by FIG. 1 has a film layer 12 and a film layer support material 14. The film layer 12 is a layer of material selected to exhibit magnetic bubble or domain characteristics, such as a ferrimagnetic garnet composition; for example, a bismuth substituted iron garnet. This film layer 12 can be prepared by liquid phase epitaxy (LPE) on the film support material 14. The film support material is selected to exhibit nonmagnetic and optically transparent characteristics, such as a garnet substrate; for example, gadolinium gallium garnet (GGG).

The film layer 12 has a plurality of similar geometric elements 16 separated by grooves 18 in a row-and-column orientation as shown by FIG. 1. The geometric elements 16 can be formed by etching or otherwise forming the grooves 18 into and/or through the film layer material 12.

Each of the geometric elements 16, which can be mesas or posts as shown, contain a volume of magnetic material that is bistable, i.e., magnetically reversible, where the easy axis of the magnetic material is perpendicular to the perspective plane of the drawing.

A plurality of column conductors 20, 22 and 24, and a plurality of row conductors 26, 28 and 30 are orthogonally positioned to act upon each of the geometric elements 16. The row-and-column conductors can be postioned in the grooves 18 as shown by FIG. 1 so that each pair of row-and-column conductors in adjoining a respective one of the elements 16; for example, row conductor 28 and column conductor 20 adjoin the sidewalls of a selected element 36 and are spaced apart from its adjacent elements as more clearly shown by FIG. 2. However, it is contemplated that the row-and-column conductors can also be aligned in a similar manner to act upon each of the geometric elements but not be positioned physically, either in part or in whole, within the grooves 18.

Figure 2:
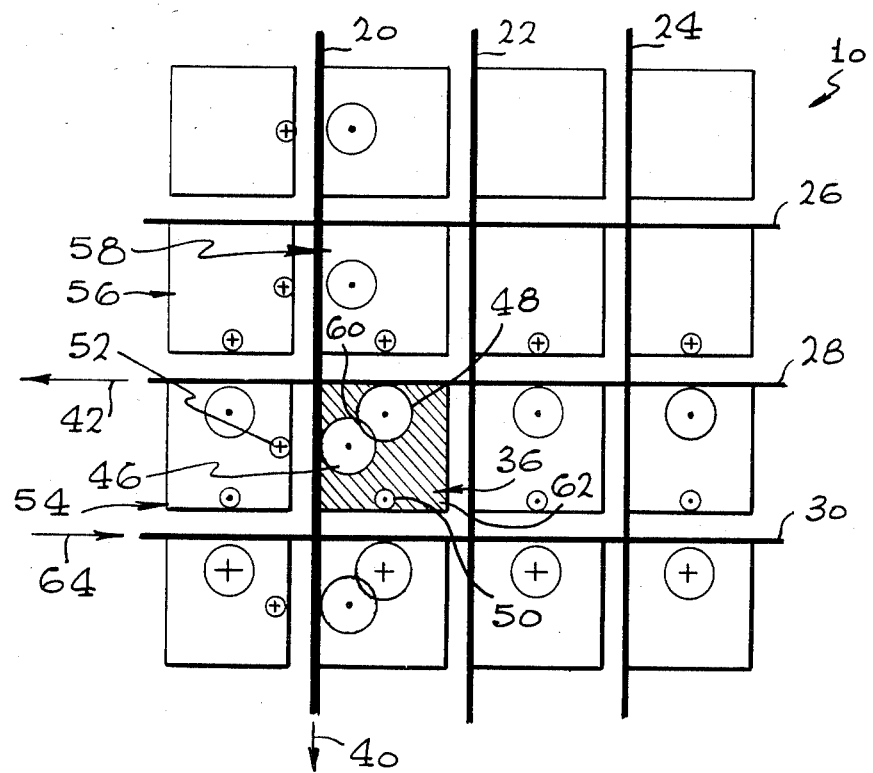
FIG. 2 is a simplified schematic of the magnetic domain lens in FIG. 1.

The matrix of row-and-column conductors as shown by FIGS. 1 and 2 permit the application of a magnetic field to a selected geometric element by coincident current select of row-and-column conductors that include the selected geometric element.

In FIG. 2, a selected post element 36 is switched by directing an electric current having a half-wave select value into the column conductor 20 and, similarly, into the row conductor 28 in the directions as indicated by each of the respective arrows 40 and 42. The circles, such as circles 46, 48 and 50 of selected post element 36, represent schematically the direction or polarity and the relative strength of the magnetic fields established by each of the energized conductors 20 and 28. The circles 46, 48 and 50 have central dots which represent magnetic fields directed out of the plane of the drawing, while the cross in circle 52 on an adjacent post element 54 represents a magnetic field directed into the plane of the drawing. Similarly, the other unnumbered circles illustrated in FIG. 2 on certain post elements of the magnetic domain lens 10, also represent polarity and the relative strengths of the magnetic fields established by the electric currents in selected conductors 20 and 28.

Row conductor 28, as more clearly shown by the schematic of FIG. 2, adjoins the sidewall of post element 36, and adjoins the sidewall of an adjacent post element 54. Row conductor 28 is spaced apart from the sidewalls of adjacent post elements 56, and 58. Column conductor 20 also adjoins the sidewall of post element 36, and adjoins the sidewall of adjacent post element 58. Column conductor 20 is spaced apart from the sidewalls of adjacent post elements 54 and 56. Thus, when conductors 20 and 28 are energized, post element 36 is the selected post element since both energized conductors adjoin its contiguous sidewalls.

The relative strengths and directions of the magnetic fields in those post elements 16 of the magnetic domain lens 10 of FIG. 2 as established by the energized conductors 20 and 28 are schematically represented by the different sizes of circles, and the dots-and crosses, therein, respectively; for example, circle 46 is relatively larger than circle 52 although both represent the magnetic field established by energized column conductor 20.

Since conductor 20 adjoins the sidewall of post element 36, it is expected and understood that the strength of its magnetic field in region 60 of the post element will be at its maximum. Therefore, circle 46 is illustrated as larger than circle 52 since circle 52 represents the strength of the magnetic field in adjacent post element 54 which as described is spaced apart from conductor 20 as illustrated by FIG. 2.

It should be understood that the strength of the magnetic fields established by the individually energized conductors may not be exactly proportional to the relative sizes of the circles as illustrated, but that this schematic representation has been chosen for purposes of a clear description of the invention.

Magnetic fields, as represented by circles 46 and 48 in FIG. 2, are aiding because of their commonality of magnetic field direction; directed out of the plane of the drawing. These magnetic fields as represented by circles 46 and 48 are at their maximum strength in the corner region 60 of post element 36 since each results from the energized conductors 20 and 28, respectively, which adjoin the contiguous sidewalls of the selected post element. It can be seen from FIG. 2 that only post element 36 has such a concentration of aiding magnetic fields at their maximum strength. Therefore, nucleation of a magnetic domain reversal or switching occurs only in selected post element 36 at the nucleation region 60.

As previously noted, the magnetic field for nucleation at region 60 of the selected post element 36 is greater than that required for propagating the domain wall which defines a boundary between the opposite directions of magnetization. The value of current required in each selected conductor to nucleate region 60 is not large enough to move the domain wall to the opposite corner 62 of the post element 36. Thus, much larger currents would be required in conductors 20 and 28 to move the domain wall from the nucleation region 60 to the opposite corner 62 of the selected post element.

In accordance with the invention, an electric current is directed into row conductor 30 in the direction indicated by arrow 64. Energized conductor 30 establishes a magnetic field in selected post element 36 as indicated by magnetic field circle 50. The magnetic field is aiding and, therefore, complements the aiding magnetic fields as represented by circles 46 and 48 that have been described above. This added current and its equivalent magnetic field aid in moving the domain wall across the selected post element, element 36 in FIG. 2, either to a point intermediate the nucleation region 60 and the opposite corner 62 of post element 36, or across the post element to the opposite corner so that the magnetic direction of the post element 36 is completely reversed.

It is significant to note and understand that the additional current in the second row conductor, here conductor 30, does not disturb the selection or addressing process by the first energized conductors, i.e., 20 and 28, which adjoin the contiguous sidewalls of the selected post element 36. However, this additional current does aid in the movement of a resulting domain wall across and through the selected post element to either an intermediate position or extinction upon complete magnetic reversal

INDUSTRIAL APPLICABILITY

The magnetic domain lens 10 of the invention has applicability as the control element for electromagnetic radiation in a magneto-optic display system.

As will be evidenced from the foregoing description, certain aspects of the invention are not limited to the particular details of construction as illustrated, and it is contemplated that other modifications and applications will occur to those skilled in the art. It is, therefore, intended that the appended claims shall cover such modifications and applications that do not depart from the true spirit and scope of the invention.

We claim:

1. In a magneto-optic device having a magnetic domain lens including a plurality of separated geometric elements wherein each of the geometric elements contain a volume of magnetic material that is bistable or magnetically reversible and has an easy axis, the magnetic domain lens further comprising:

(a) first means establishing additive magnetic fields to nucleate a magnetic domain reversal in a selected geometric element, and (b) second means establishing an aiding magnetic field to assist the propagation of a domain wall associated with the nucleated magnetic domain reversal through said selected element so that a desired degree of magnetic reversal of said element is completed.

2. The magnetic domain lens of claim 1 in which said aiding magnetic field is an additive field proportionately less than individual ones of said additive magnetic fields established by said first means.

3. The magnetic domain lens of claim 1 in which said first means is at least a pair of electrical conductors having respective first and second ones of said pair positioned to adjoin associated first and second surfaces of said selected geometric element.

4. The magnetic domain lens of claim 3 in which the nucleation of said magnetic domain reversal occurs in a nucleation region of said selected geometric element.

5. The magnetic domain lens of claim 4 in which said selected geometric element is quadrilateral.

6. The magnetic domain lens of claim 5 in which said quadrilateral geometric element is square.

7. The magnetic domain lens of claim 5 in which said nucleation region is a corner region of said quadrilateral geometric element.

8. The magnetic domain lens of claim 7 in which said propagation of said domain wall associated with the nucleation magnetic domain reversal is through said element toward an opposite corner region relative to said nucleation corner region.

9. The magnetic domain lens of claim 8 in which said propagation of said domain wall is through said element to and including said opposite corner region so that magnetic domain reversal in said element is complete.

10. The magnetic domain lens of claim 8 in which said propagation of said domain wall is through said element to an intermediate point between said corner region and said opposite corner region.

11. The magnetic domain lens of claim 4 in which said associatd surfaces develop said necleation region therebetween.

12. The magnetic domain lens of claim 11 in which said respective ones of said pair of conductors cross adjoining said nucleation region.

13. The magnetic domain lens of claim 3 in which said pair of electrical conductors are row and column conductors.

14. The magnetic domain lens of claim 13 in which said row and column conductors are positioned orthogonal to each other.

15. The magnetic domain lens of claim 3 in which said second means is a third electrical conductor both spaced apart from said selected geometric element and said first one of said pair of conductors, and crossing the second one of said pair of electrical conductors.

16. The magnetic domain lens of claim 15 in which said third conductor is parallel with said first one of said pair of conductors.

* * * * *